United States Patent
Luo

(10) Patent No.: US 8,652,931 B1
(45) Date of Patent: Feb. 18, 2014

(54) METHOD OF DUAL-DEPTH STI FORMATION

(71) Applicant: Shanghai Huali Microelectronics Corporation, Shanghai (CN)

(72) Inventor: Fei Luo, Shanghai (CN)

(73) Assignee: Shanghai Huali Microelectronics Corporation, Pudong, Shanghai (CN)

( * ) Notice: Subject to any disclaimer, the term of this patent is extended or adjusted under 35 U.S.C. 154(b) by 0 days.

(21) Appl. No.: 13/728,190

(22) Filed: Dec. 27, 2012

(30) Foreign Application Priority Data

Oct. 8, 2012 (CN) .......................... 2012 1 0375753

(51) Int. Cl.
*H01L 21/76* (2006.01)

(52) U.S. Cl.
USPC ............................. 438/421; 438/424; 438/427

(58) Field of Classification Search
USPC ........................ 438/404, 405, 421, 424, 427
See application file for complete search history.

(56) References Cited

U.S. PATENT DOCUMENTS

| 6,599,811 | B1 | 7/2003 | Kazama et al. | |
| 7,211,498 | B2 * | 5/2007 | Kim | 438/427 |
| 7,427,552 | B2 * | 9/2008 | Jin et al. | 438/424 |
| 8,227,339 | B2 * | 7/2012 | Ponoth et al. | 438/638 |
| 2007/0066030 | A1 * | 3/2007 | Kim | 438/427 |
| 2009/0072355 | A1 * | 3/2009 | Cheng et al. | 257/622 |
| 2012/0276820 | A1 | 11/2012 | Zhang et al. | |
| 2012/0302038 | A1 | 11/2012 | Zheng et al. | |
| 2012/0322222 | A1 | 12/2012 | Xu et al. | |
| 2012/0322256 | A1 | 12/2012 | Hu et al. | |
| 2013/0020652 | A1 | 1/2013 | Huang et al. | |
| 2013/0034962 | A1 | 2/2013 | Yu | |
| 2013/0049119 | A1 | 2/2013 | Huang et al. | |

FOREIGN PATENT DOCUMENTS

| CN | 1197142 C | 4/2005 |
| CN | 102627252 A | 8/2012 |

* cited by examiner

*Primary Examiner* — Kevin M Picardat
(74) *Attorney, Agent, or Firm* — Howard & Howard Attorneys PLLC

(57) ABSTRACT

The present invention is related to the trench manufacturing field in semiconductor, especially a manufacturing method of STI structure with difference depth which is apply to the imaging sensor including forming a dielectric layer with different thickness on the substrate which includes a first region and a second region, then forming a first type trench in the thick dielectric layer and a second type trench in the thin dielectric layer, and etching the substrate of the first region and the substrate of the second region, and thus form a first STI and a second STI with different depth which are located in the substrate of the first region and the second region respectively.

13 Claims, 2 Drawing Sheets

METHOD OF DUAL-DEPTH STI FORMATION

CROSS-REFERENCE TO RELATED APPLICATION(S)

The present application claims the benefit of priority under 35 U.S.C. 119 to Chinese Application Serial No. 201210375753.1, filed Oct. 8, 2012.

FIELD OF THE INVENTION

The present invention is related to the trench manufacturing field in semiconductor, especially a manufacturing method of STI structure with difference depth which is apply to the imaging sensor.

BACKGROUND OF THE INVENTION

CMOS imaging sensor (CIS for short) is widely used for its high integration, low power consumption and low cost, such as the application in digital camera equipment. Wherein CIS equipment is used for sensing the light projected to the semiconductor substrate and further utilizing the active pixel array of a photodiode and a transistor in a semiconductor device, thus converting the image mode acquired (such as convert it to a digital signal or electronic signals). The image quality is one of the most important indicators to measure the performance of the CMOS image sensor. It is an effective way to get good image quality that improving the signal-to-noise ratio of the device. We may increase the signal-to-noise ratio by increase the proportion of the active area for collecting light signal in the total chip area (i.e. pixel fill rate) on the layout design. The active area of the photosensitive device and the active area of the control device is separated by trench in the active area morphology of the image sensor pixel unit area. With the increase of pixel fill rate, the size of the isolation trench will decrease because of the increase of the active area size. Problems will occur as the depth to width ratio of the structure is too large when the isolation trench is decreased to a certain extent, such as void or gap.

In order to solve the problem, mature solution at present is patterning the pixel unit area and the logic circuit area outside in the image sensor by using the forming process of the active region twice, so we may control the depth of the isolation trenches in two different regions by the difference in etching time and appropriately reduce the depth of the pixel unit area so as to decrease the depth-to-width ratio of the trench in this area. Thus to solve the problem of insufficient filling in trenches. But such process needs to pattern the active area repeatedly and require additional photomask, and the process is quite complex at the same time, which inevitably increases the manufacturing costs.

SUMMARY OF THE INVENTION

According to the problems mentioned above, the present invention disclosed a method of Dual-depth STI formation in an embodiment, comprising the following steps:

Step S1. form a pad oxide layer, a first mask layer and a poly-silicon layer in sequence from the bottom up on a substrate which contain a first region and a second region; The poly-silicon layer comprises at least a first overlapping portion with the first region and a second overlapping portion with the second portion;

Step S2. coat a first photoresist layer on said poly-silicon layer and a first opening pattern is then formed in the first photoresist layer to expose said second overlapping portion;

Step S3. inject dopant to said second overlapping portion along said first opening pattern by using the first photoresist layer as a mask;

Step S4. deposit a second mask layer on said poly-silicon layer after removing the first photoresist, said second mask layer includes a thick mask layer portion located on the first overlapping portion and a thin mask layer which have step difference relative to said thick mask layer located on the second overlapping portion;

Step S5. coat a second photoresist layer on said second mask layer, then a second opening pattern which exposed at least a portion area on the upper surface of said thick mask layer is formed in the second photoresist layer and a third opening pattern which exposed at least a portion area on the upper surface of said thin mask layer is formed;

Step S6. etch said thick mask layer portion, said poly-silicon layer and said first mask layer along said second opening pattern to form a first type trench by using the second photoresist layer as a mask and etch said thin mask layer portion, said poly-silicon layer, said first mask layer and said pad oxide layer along said second opening pattern to form a second type trench.

Wherein the forming time of the second type trench is shorter than the first trench's and thus to etch a second STI with a first depth D1 on the upper surface of said substrate's second region which exposed in said second type trench.

Step S7, etch the region of said pad oxide layer which exposed in the first type trench along said first type trench after removing said second photoresist layer. And then etch the first region of said substract to form a first STI with a third depth D3 along the first trench; and Etch the portion of said substrate's second region which located on the below part of the second SPI with a first depth D1 to the first SPI with a second depth D2, wherein the second depth D2 is deeper than the first depth D1 and the third depth D3.

The method mentioned above, wherein the first mask layer is a silicon nitride layer.

The method mentioned above, wherein the thickness of poly-silicon layer is 150~250 angstroms.

The method mentioned above, wherein said dopant is the N-type dopant.

The method mentioned above, wherein inject the arsenic atoms with a concentration of 2*E15 per square centimeter as the dopant to said second overlapping portion by 1000 electron volts energy in step S3.

The method mentioned above, wherein said second mask layer is the cryogenic silicon oxide layer formed by the deposition process of cryogenic; said thin mask layer is 300 angstroms and said thick mask layer is 400 angstroms in step S4.

The method mentioned above, wherein the etching process will be over after completing the etching of the first mask layer and exposing part area of the pad oxide layer in the first type trench when forming said first type trench in the step S6.

The method of mentioned above, wherein said first region and second region are a pixel unit area and a peripheral circuit area respectively;

said first region is used for forming NMOS device and said second region is used for forming NMOS device and PMOS device.

In another embodiment, the present invention disclosed a method of Dual-depth STI formation, comprising the following steps:

Form a dielectric layer on the substrate which comprises a first region and a second region, said dielectric layer includes a thick dielectric layer on said first region and a dielectric layer which have step difference relative to said thick dielectric layer on said second region;

etch said thick dielectric layer to form a first type trench and reserve the portion of the thick dielectric layer below the first trench, etch said thin dielectric layer to form a second type trench;

the second type trench forms earlier than the first type trench before the etching is over and thus to etch a second STI with a first depth D1 on the upper surface of said substrate's second region which exposed in said second type trench;

etch the region of said thick dielectric layer which are reserved below the first trench along said first type trench. Further etch the first region of said substract to form a first STI with a third depth D3 along the first STI; and Etch the portion of said substrate's second region which located on the below part of the second SPI with a first depth D1 to the first SPI with a second depth D2, wherein the second depth D2 is deeper than the first depth D1 and the third depth D3.

The method mentioned above, wherein said dielectric layer is a single layer or a composite layer with multi-layer overlay.

The method mentioned above, wherein the dielectric layer conclude a pad oxide layer, a first mask layer, a poly-silicon layer and a second mask layer in sequence from the bottom up when the dielectric layer is a multi-layer overlay;

Wherein said second mask layer includes a thick mask layer portion overlapped with the first region and a thin mask layer portion which have step difference relative to said thick mask layer portion and overlapped with the second region, thus form the thickness difference between the thick dielectric layer and the thin dielectric layer.

The method mentioned above, wherein the thick dielectric layer which are reserved below the first trench is said a pad oxide layer.

The method mentioned above, wherein the formation of the thick mask layer and the thin mask layer comprises the steps of: inject the dopant to the second overlapping portion formed by the poly-silicon layer and the second region of the substrate rather than inject the dopant to the first overlapping portion formed by the poly-silicon layer and the first region of the substrate, thereby the generation of the second mask layer above the first overlap portion is faster than that above the second overlapping portion.

The present invention provides a method for decreasing the depth of the isolation trench in pixel unit area by photolithography and etching in the active area for only one time. It also simplify the process and reduce the manufacturing cost at the same time.

DETAILED DESCRIPTION OF THE PREFERRED EMBODIMENT

The following context of the present invention will be further described by the embodiments for a better understanding of the present invention. What should be noticed is that the embodiments just act as examples, which does not limit the scope of the present invention.

Figure 1:
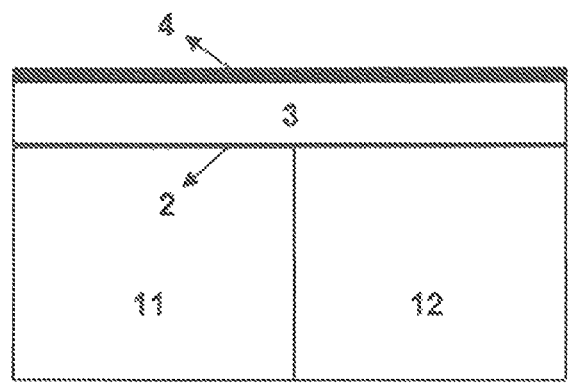
FIG. 1 illustrated the formation structure diagram of the pad oxide layer, the silicon nitride layer and the poly-silicon layer structure diagram in sequence.

Illustrated as FIG. 1, first form a pad oxide layer 2, a first mask layer 3 by deposition in sequence from the bottom up on a monocrystalline semiconductor substrate which comprises at least pixel cell region 11 and peripheral circuit region 12, the typical first mask layer can be SiN silicon nitride layer 3, SiON layer, etc, then deposit a poly-silicon layer 4 with a thickness from 150 to 250 angstroms on the first mask layer 3, preferably 200 angstroms. In some implementation, the pad oxide layer 2, the a first mask layer 3 and the poly-silicon layer 4 are regarded as a dielectric layer as a whole. Then illustrated as FIG. 2, a first photoresist layer 5 is coated on poly-silicon layer 4, also known as a photoresist coating, such as a negative photoresist layer. After exposure of the lithographic process, the first photoresist layer 5 will form a first opening pattern 51 in the first photoresist layer 5 to expose the second overlapping portion 42 of the poly-silicon layer 4 which is behind the pad oxide layer 2 and the first mask layer 3 and also overlapped with the peripheral circuit region 12. Wherein the first overlapping portion 41 of the poly-silicon layer 4 which is behind the pad oxide layer 2 and the first mask layer 3 and also overlapped with the pixel unit area 11 is covered by the first photoresist layer 5.

Figure 2:
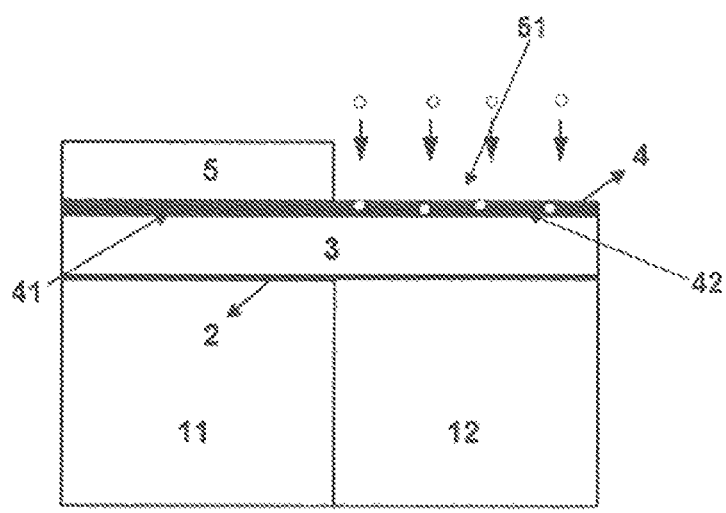
FIG. 2 illustrated the diagram of the ion injection.

Illustrated as FIG. 2, then inject dopant to the second overlapping portion 42 along first opening pattern 51 by using the first photoresist layer 5 as a mask, thus the second overlap portion 42 is rich in N-type dopant. This step may require injecting with high doses of N-type dopant and injection may be a single injection or multiple injection as needed. As an alternative implementation, it may inject the arsenic atoms with a concentration of 2*E15 per square centimeter as the dopant to said second overlapping portion by 1000 electron volts energy. Generally, after the ion injection and removing the photoresist, there will be a step of annealing.

Figure 3:
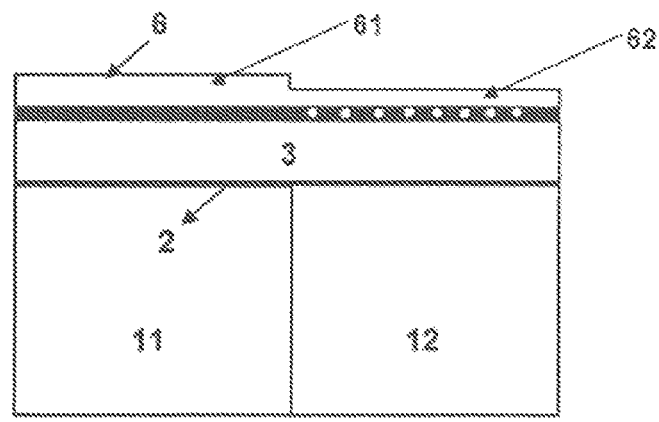
FIG. 3 illustrated the structure diagram after forming the cryogenic silicon oxide layer.

Illustrated as FIG. 3, remove the first photoresist layer 5 by ashing process, and then deposit on the poly-silicon layer 4 to form a second mask layer 6 with a thickness from 300 to 500 angstroms. The chemical vapor deposition method is suitable for the generation of the first mask layer 6, typical, such as the use of the cryogenic silicon oxide deposition process for forming a cryogenic silicon oxide layer as the first mask layer 6. The temperature of the cryogenic silicon oxide deposition process is from 350 to 450° C., preferred temperature is 400° C., in addition, the main reaction gas is tetraethoxysilane (TEOS) and O3. It's worth mentioning that since the poly-silicon layer 4 contains the doped second overlapping portions 42 and the undoped first overlapping portion 41 and doping will influence the growth rate of silicon oxide. It can be observed that the atomic arrangement on the surface of the second overlapping portion 42 is disturbed and it will be no longer flat from a microscopic point, which is not conducive for the oxidation silicon atoms bonded to each other to form a thin film in the deposition process and eventually slow down the deposition of silicon oxide. As the overlapping portion 41 didn't pass process of the doping ion implantation, so the deposition rate on the silicon oxide surface will not be influenced. Thus the second mask layer 6 deposited on the poly-silicon layer 4 will comprise at least two part with different thickness: the thin mask layer 62 on the second overlapping portion 42 and thick mask layer 61 on the first overlapping portion, thus form a step difference between the thick mask layer 61 and the thin mask layer 62. In one embodiment, the thickness of the thick mask layer could be 400 angstroms while the thickness of the thin mask layer that formed at the same time is about 300 angstroms. So the dielectric layer formed on the substrate comprises the thick dielectric layer on the pixel unit area 11 and the thin dielectric layer which have step difference relative to thick dielectric layer on peripheral circuit area 12. Just because the second mask layer 6 comprises the thick mask layer 61 overlapped with the pixel unit area 11 and the thin mask layer 62 overlapped with the peripheral circuit area 12, and thus form the thick dielectric layer by the pad oxide layer 2, the first mask layer 3, the first overlapping portion 41 and the thick mask layer 61 on the pixel unit area 11. Also, the thin dielectric layer is formed by the pad oxide layer 2, the first mask layer 3, the second overlapping portion 42 and the thin mask layer 62 on the peripheral circuit area 12.

Figure 4:
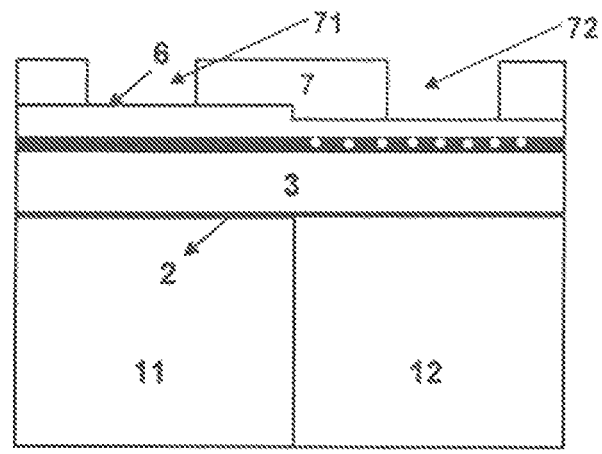
FIG. 4 illustrated the structure diagram of spin coating a photoresist for the first time and forming a patternized opening.
Figure 5:
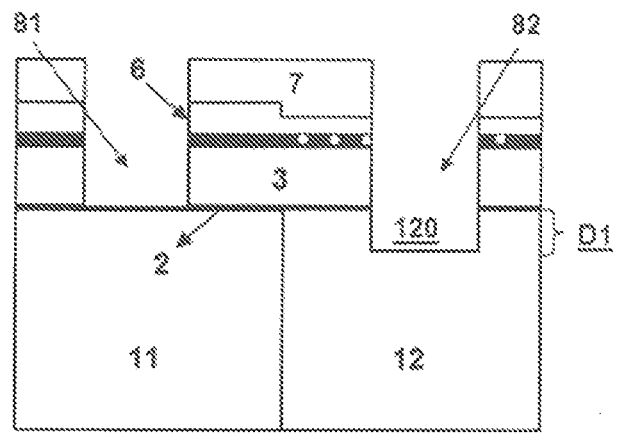
FIG. 5 illustrated the structure diagram of etching the pad oxide layer, the silicon nitride layer and the poly-silicon layer in sequence.

Illustrated as FIG. 4, then, coat a first photoresist layer 7 on the second mask layer 6. A second opening pattern and a third opening pattern is then formed in the second photoresist layer 7, it will expose at least a portion area on the upper surface of thick mask layer 61 in the second opening pattern 71 and expose at least a portion area on the upper surface of thin mask layer 62 in the third opening pattern 72. Illustrated as FIG. 5, after that, etching along the second opening pattern 71 by using the second photoresist layer 7 as a mask, and thus it will form a first type trench 81 which pass through the thick mask layer portion 61, the poly-silicon layer 4 and the first mask layer 3. The first type trench 81 aims at the substrate of the pixel unit area 11. Similarly, etching along the opening pattern 72 and thus it will form a second type trench 82 which pass through the thin mask layer portion 62, the poly-silicon layer 4, the first mask layer 3 and the pad oxide layer 2. The second type trench 81 aims at the substrate of peripheral circuit area 12. In the process of the first type trench 81, the etching will stop at the pad oxide layer 2 after the completion of etching on the first mask layer 3.

In an optional embodiment, the process of dry etching to form the first type trench and the second type trench is the dry plasma process for etching. The type of etching chamber is the inductively coupled plasma, etc. The technological conditions of dry plasma process for etching is: Pressure 4~6 milli-torr, the RF power frequency is from 12.00 to 15.00 MHz, the RF power supply of the top electrode is 700 to 850 watts, the lower electrode RF power bias is 70 to 90 volts, HBr gas flow rate is 150 to 250 standard cubic centimeters per minute, SF6 gas flow rate is 15 to 30 standard cubic centimeters per minute, and the oxygen gas flow rate is 1 to 10 standard cubic centimeters per minute. Preferred conditions for etching is: Pressure is 5 milli-torr, the RF power frequency is 13.56 MHz, the RF power supply of the top electrode is 780 watt, the lower electrode RF power bias is 80 volts, HBr gas flow rate is 200 standard cubic centimeters per minute, SF6 gas flow rate is 20 standard cubic centimeters per minute, and the oxygen gas flow rate is 8 standard cubic centimeters per minute.

In an embodiment, the stop mode of the dry etching is the endpoint detection method. The etching will stop immediately once a part of the pad oxide layer 2 is exposed in the first type trench. In the step, As the thickness of the thick mask layer 61 and the thin mask layer 62 is different, so the time costed in etching the thin mask layer 62 is shorter than that in the thick mask layer 61, thus the forming time of the second type trench 82 is shorter than the first trench's 81. On this basis, before the formation of the first type trench 81, as well before the stop time of etching, the second type trench 82 has been formed. So the portion on the substrate area of the peripheral circuit region 12 will inevitably be exposed in the second trench 82 ahead of time, while the etching is proceeding at the same time. Another side effect brought is the exposure time of the substrate on the peripheral circuit region 12 is earlier than the completion time of etching the first mask layer 3 by forming the first type trench 81. Then a second STI 120 with a first depth of D2 is formed by etching at the top of the substrate on the peripheral circuit region 12. Thus a second trench 120 which is less than the target depth is formed at the moment and the etching process will last until the first type trench is completely formed and a part of the first mask layer 3 area is exposed.

Figure 6:
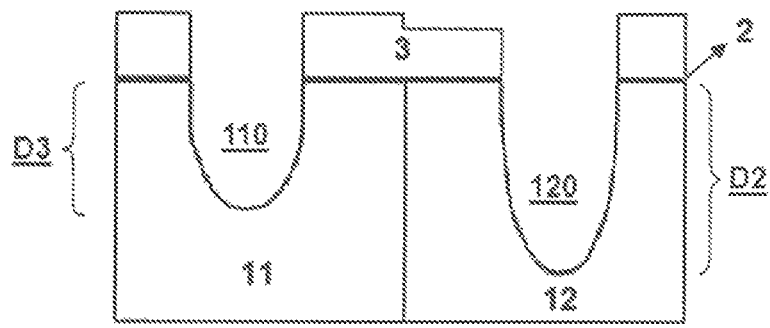
FIG. 6 illustrated the structure diagram of forming a Dual-depth STI.

Illustrated as FIG. 6, after removing the photoresist layer 7, etch the first mask layer 3 and the substrate of the pixel unit area 11 along the first type trench 81 and form the shallow trench isolation 110 (STI for short) with a third depth of D3. And etch the low part of the second STI 120 with a first depth of D1 which is set on the substrate of the peripheral circuit region 12 until the second STI 120 has a higher depth of D2 than the first depth D1. At the time the second STI 120 with a target depth is formed at that time. The amount of the substract etched on the pixel unit area 11 and the peripheral circuit region 12 is roughly the same since the etching time is the same. So the second depth D2 is certainly higher than the third depth D3, that is D2−D1=D3, and thus form the Dual-depth STI structure with different depth as FIG. 6 illustrated. During the time, the second mask layer 6, the poly-silicon layer 4 is etched back. Part of the overlapping portion between the first mask layer 3 and the substrate of the peripheral circuit region 12 will be etched, which may lead to the reduction in its thickness.

The technological conditions for forming Dual-depth STI is: the pressure is 8 to 12 milli-torr, the RF power frequency is from 13.00 to 14.00 MHz, the RF power supply of the top electrode is 900 to 1000 watts, the lower electrode RF power bias is 120 to 140 volts, chlorine gas flow rate is 40 to 60 standard cubic centimeters per minute, HBr gas flow rate is 230 to 260 standard cubic centimeters per minute, and oxygen gas flow rate is 4 to 7 standard cubic centimeters per minute. As an optical condition is: the pressure is 10 milli-torr, the RF power frequency is 13.56 MHz, the RF power supply of the top electrode is 950 watt, the lower electrode RF power bias is 130 volts, chlorine gas flow rate is 50 standard cubic centimeters per minute, HBr gas flow rate is 250 standard cubic centimeters per minute, and the oxygen gas flow rate is 5 standard cubic centimeters per minute. Under the condition of the etching time of 40 seconds, the depth of the second STI with a depth of D2 which formed on the substrate of the peripheral circuit region 12 is about 3500 angstroms. While the depth of the first STI with a depth of D3 which formed on the substrate of the pixel unit area 11 is about 3200 angstroms.

The STI could use the high density plasma chemical vapor deposition (HDPCVD) to form the oxides of silicon and fill the oxides of silicon in a subsequent step, thus finally form the so-called STI structure. Notably, the depth of the first STI 110 on the pixel unit area 11 will decrease by 8% as the second STI on the peripheral circuit region 12 is formed by steps. So the distance size between the active areas on the pixel unit area 11 can be reduced by 8% in equal proportion without the problem of insufficient filling in trenches. Thus it is a good technical proposal to solve the difficulties brought by the high ratio of width to depth.

Typically, the substrate of the pixel unit area 11 could be used to produce the NMOS device and the substrate of the peripheral circuit region 12 could be used to produce the PMOS device. In addition, the present disclosure also called the pixel unit area of CIS equipment as the first region and the peripheral circuit region as the second region.

The context showed a specific structure of implementation and typical embodiments by description and figure and it may have other conversion based on the spirit of the present invention. Although the above disclosed the preferred embodiments of the present invention, the present invention is not limited by the embodiments described. For the technicist in the field, any modifications and substitutions will be obvious after reading the description above. So the accompanying claims should be treated as all changes and modifications to the true meaning and scope of the present invention. Any equivalent modifications and substitutions in the range of the present invention's spirit are under the meaning and the scope of the present invention.

What is claimed is:

1. A method of Dual-depth STI formation, said method comprising the following steps of:
    step S1. form a pad oxide layer, a first mask layer and a poly-silicon layer in sequence from the bottom up on a substrate which contain a first region and a second region; The poly-silicon layer comprises at least a first overlapping portion with the first region and a second overlapping portion with the second portion;
    step S2. coat a first photoresist layer on said poly-silicon layer and a first opening pattern is then formed in the first photoresist layer to expose said second overlapping portion;
    step S3. inject dopant to said second overlapping portion along said first opening pattern by using the first photoresist layer as a mask;
    step S4. deposit a second mask layer on said poly-silicon layer after removing the first photoresist, said second mask layer includes a thick mask layer portion located on the first overlapping portion and a thin mask layer which have step difference relative to said thick mask layer located on the second overlapping portion;
    step S5. coat a second photoresist layer on said second mask layer, then a second opening pattern which exposed at least a portion area on the upper surface of said thick mask layer is formed in the second photoresist layer and a third opening pattern which exposed at least a portion area on the upper surface of said thin mask layer is formed;
    step S6. etch said thick mask layer portion, said poly-silicon layer and said first mask layer along said second opening pattern to form a first type trench by using the second photoresist layer as a mask and etch said thin mask layer portion, said poly-silicon layer, said first mask layer and said pad oxide layer along said second opening pattern to form a second type trench;
    wherein the forming time of the second type trench is shorter than the first trench's and thus to etch a second STI with a first depth D1 on the upper surface of said substrate's second region which exposed in said second type trench;
    step S7. etch the region of said pad oxide layer which exposed in the first type trench along said first type trench after removing said second photoresist layer and then etch the first region of said substract to form a first STI with a third depth D3 along the first trench; and
    etch the portion of said substrate's second region which located on the below part of the second SPI with a first depth D1 to the first SPI with a second depth D2, wherein the second depth D2 is deeper than the first depth D1 and the third depth D3.

2. The method of claim 1, wherein the first mask layer is a silicon nitride layer.

3. The method of claim 1, wherein the thickness of poly-silicon layer is 150~250 angstroms.

4. The method of claim 1, wherein said dopant is the N-type dopant.

5. The method of claim 4, wherein inject the arsenic atoms with a concentration of 2*E15 per square centimeter as the dopant to said second overlapping portion by 1000 electron volts energy in step S3.

6. The method of claim 1, wherein said second mask layer is the cryogenic silicon oxide layer formed by the deposition process of cryogenic; said thin mask layer is 300 angstroms and said thick mask layer is 400 angstroms in step S4.

7. The method of claim 1, wherein the etching process will be over after completing the etching of the first mask layer and exposing part area of the pad oxide layer in the first type trench when forming said first type trench in the step S6.

8. The method of claim 1, wherein said first region and second region are a pixel unit area and a peripheral circuit area respectively, wherein said first region is used for forming NMOS device and said second region is used for forming NMOS device and PMOS device.

9. A method of Dual-depth STI formation, said method comprising the following steps of:
    forming a dielectric layer on the substrate which comprises a first region and a second region, said dielectric layer includes a thick dielectric layer on said first region and a dielectric layer which have step difference relative to said thick dielectric layer on said second region;
    etching said thick dielectric layer to form a first type trench and reserve the portion of the thick dielectric layer below the first trench;
    etching said thin dielectric layer to form a second type trench, the second type trench forms earlier than the first type trench before the etching is over and thus to etch a second STI with a first depth D1 on the upper surface of said substrate's second region which exposed in said second type trench;
    etching the region of said thick dielectric layer which are reserved below the first trench along said first type trench and further etching the first region of said substract to form a first STI with a third depth D3 along the first STI; and
    etching the portion of said substrate's second region which located on the below part of the second SPI with a first depth D1 to the first SPI with a second depth D2, wherein the second depth D2 is deeper than the first depth D1 and the third depth D3.

10. The method of claim 9, wherein said dielectric layer is a single layer or a composite layer with multi-layer overlay.

11. The method of claim 10, wherein the dielectric layer conclude a pad oxide layer, a first mask layer, a poly-silicon layer and a second mask layer in sequence from the bottom up when the dielectric layer is a multi-layer overlay, wherein said second mask layer includes a thick mask layer portion overlapped with the first region and a thin mask layer portion which have step difference relative to said thick mask layer portion and overlapped with the second region, thus form the thickness difference between the thick dielectric layer and the thin dielectric layer.

12. The method of claim 11, wherein the thick dielectric layer which are reserved below the first trench is said a pad oxide layer.

13. The method of claim 11, wherein the formation of the thick mask layer and the thin mask layer comprises the steps of injecting the dopant to the second overlapping portion formed by the poly-silicon layer and the second region of the substrate rather than injecting the dopant to the first overlapping portion formed by the poly-silicon layer and the first region of the substrate, thereby the generation of the second mask layer above the first overlap portion is faster than that above the second overlapping portion.

* * * * *